United States Patent
Strunk et al.

(10) Patent No.: US 11,030,363 B2
(45) Date of Patent: Jun. 8, 2021

(54) PHYSICS ENGINE WITH PERMISSIVE RIGID BODY PENETRATION

(71) Applicant: MICROSOFT TECHNOLOGY LICENSING, LLC, Redmond, WA (US)

(72) Inventors: Oliver Michael Strunk, Munich (DE); Nathanael Presson, Namyangju (KR)

(73) Assignee: Microsoft Technology Licensing, LLC, Redmond, WA (US)

( * ) Notice: Subject to any disclaimer, the term of this patent is extended or adjusted under 35 U.S.C. 154(b) by 388 days.

(21) Appl. No.: 15/362,664

(22) Filed: Nov. 28, 2016

(65) Prior Publication Data

US 2017/0344680 A1 Nov. 30, 2017

Related U.S. Application Data

(60) Provisional application No. 62/341,552, filed on May 25, 2016.

(51) Int. Cl.
*G06F 30/20* (2020.01)

(52) U.S. Cl.
CPC .................................. *G06F 30/20* (2020.01)

(58) Field of Classification Search
CPC ........................................................ G06F 30/20
See application file for complete search history.

(56) References Cited

U.S. PATENT DOCUMENTS

| | | |
|---|---|---|
| 7,084,869 B2 | 8/2006 | Sriram et al. |
| 7,458,812 B2 | 12/2008 | Sporbert et al. |
| 9,142,022 B2 | 9/2015 | Melax et al. |
| 2002/0089500 A1 | 7/2002 | Jennings et al. |
| 2002/0161562 A1 | 10/2002 | Strunk et al. |
| 2005/0001831 A1 | 1/2005 | Shih et al. |
| 2005/0187742 A1 | 8/2005 | Collodi |
| 2006/0149516 A1* | 7/2006 | Bond ....................... G06F 30/20 703/6 |
| 2008/0034023 A1* | 2/2008 | Nagano ................... G06T 17/10 708/100 |

(Continued)

OTHER PUBLICATIONS

Kaufman et al., Fast Frictional Dynamics for Rigid Bodies, Association for Computing Machinery, Inc., 2005, 946-956 (Year: 2005).*

(Continued)

*Primary Examiner* — Omar F Fernandez Rivas
*Assistant Examiner* — Michael Edward Cocchi
(74) *Attorney, Agent, or Firm* — Alleman Hall Creasman & Tuttle LLP

(57) ABSTRACT

A physics engine executed on a processor to simulate real-time rigid body dynamics of a simulated physical system with permissive penetration functionality is provided. The physics engine may be configured to iteratively loop through a collision detection phase, solving phase, updating phase, and display phase. When a penetration between a pair of bodies is due to an initial penetration from a prior collision detection phase, the physics engine may permit the initial penetration between the pair of objects during the current solving phase by not applying a bias or position change to correct for the initial penetration. Also the physics engine may be configured to detect geometry changes and modify the initial penetration distance accordingly.

20 Claims, 10 Drawing Sheets

(56) References Cited

U.S. PATENT DOCUMENTS

2012/0084048 A1 4/2012 Moravanszky
2014/0104274 A1 4/2014 Hilliges et al.
2014/0244221 A1 8/2014 Tonge et al.

OTHER PUBLICATIONS

David Baraff, Curved Surfaces and Coherence for Non-penetrating Rigid Body Simulation, Computer Graphics, vol. 24, No. 4, Aug. 1990, pp. 19-28 (Year: 1990).*
Ye et al. Fast Discrete Intersection Detection for Cloth Penetration Resolution, 2015 IEEE International Conference on Multimedia Big Data, 2015, pp. 352-357 (Year: 2015).*
Fisher, et al., "Deformed Distance Fields for Simulation of Non-Penetrating Flexible Bodies", In Proceedings of the Eurographic workshop on Computer animation and simulation, Sep. 1, 2001, 14 pages.
"Collisions with Rigid Bodies", Published on: Sep. 18, 2011 Available at: http://softimage.wiki.softimage.com/xsidocs/rigidbody_CreatingCollisionswithRigidBodies.htm.

* cited by examiner

COLLISION DETECTION

NON-PENETRATION CONSTRAINT ENFORCED
VELOCITY PROPORTIONAL TO PENETRATION
DISTANCE ACTS ON CONTACT POINT TO
RESOLVE PENETRATION

PRIOR FRAME

CURRENT FRAME

US 11,030,363 B2

PHYSICS ENGINE WITH PERMISSIVE RIGID BODY PENETRATION

CROSS REFERENCE TO RELATED APPLICATIONS

This application claims priority to U.S. Provisional Patent Application No. 62/341,552, filed May 25, 2016, the entirety of which is hereby incorporated herein by reference.

BACKGROUND

Physics engines with real-time iterative rigid body dynamics solvers are used in a variety of computer graphics applications, to simulate the motion of rigid bodies in real-time in a simulated physical environment. Such solvers do not find perfect solutions, but rather find approximate solutions. It is a challenge therefore, of such solvers to find approximate solutions quickly, efficiently, and sufficiently accurately for the needs of the application. One area in particular that physics engines face challenges is the handling of non-penetration constraints of rigid bodies. These challenges, the manner in which they are addressed, and the attendant potential beneficial technical effects thereof are further discussed below.

SUMMARY

According to one aspect of the present disclosure, a computing device is provided which includes a processor configured to execute a physics engine to simulate real-time rigid body dynamics of a simulated physical system including a plurality of bodies. The physics engine may be configured to iteratively loop through a collision detection phase, solving phase, updating phase, and display phase. The physics engine may further be configured to, in a current collision detection phase, identify colliding pairs of bodies of the plurality of bodies, and for each identified pair, determine that a penetration exists between the pair of bodies. The physics engine may be further configured to, in a current solving phase, determine whether the penetration is due to an initial penetration between the pair of bodies from a prior collision detection phase. Based on the determining, when the penetration is due to an initial penetration from a prior collision detection phase, the physics engine may permit the initial penetration between the pair of objects during the current solving phase by not applying a bias or position change to correct for the initial penetration. Further, based on the determining, when the penetration is not due to an initial penetration from a prior collision detection phase, the physics engine may apply a bias to or calculate a position change for at least one of the bodies as an estimated correction for the penetration. The physics engine may be configured to, in an updating phase, reposition the at least one of the bodies based upon the applied bias or position change. Further, in a display phase, the physics engine may be configured to output data representations of the pair of bodies including the at least one repositioned body to a display associated with the computing device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
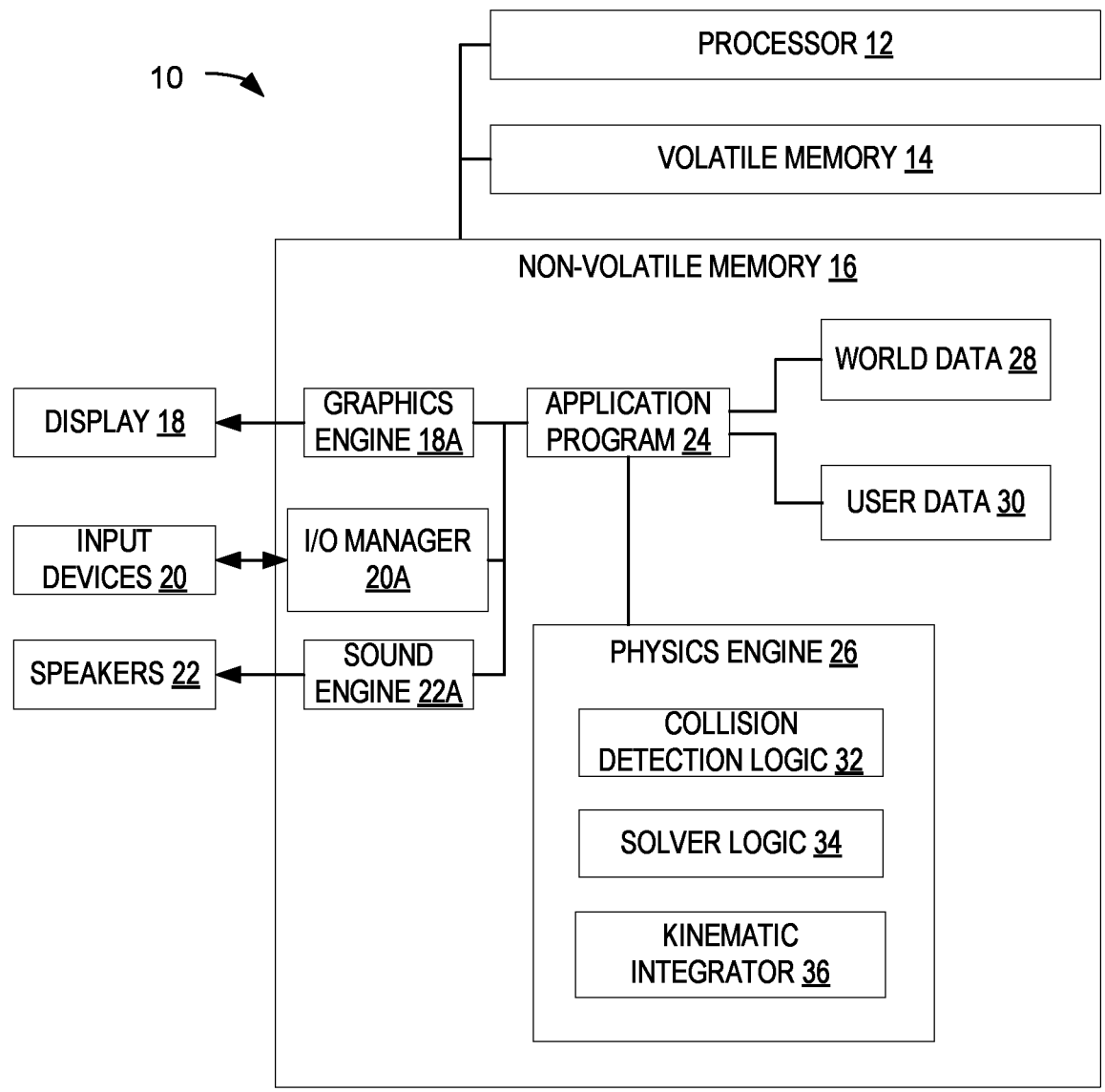
FIG. 1 shows a computing device equipped with a physics engine having a rigid body dynamics solver that is permissive of initial penetration of bodies, according to one embodiment of the present disclosure.

FIG. 1 illustrates a computing device 10 configured with a physics engine having a rigid body dynamics solver with permissive penetration features, according to one embodiment of the present disclosure. Computing device 10 includes a processor 12, volatile memory 14 such as RAM, non-volatile memory 16 such as a hard disk or FLASH memory, a display 18, input devices 20 such as a mouse, keyboard, touchscreen, etc., and one or more speakers 22. The processor 12 is configured to execute various software programs, such as application program 24, which are stored in non-volatile memory 16, using portions of volatile memory 14. Drivers such as a graphics engine 18A, an I/O manager 20A, and sound engine 22A enable communication between application program 24 and the display 18, input devices 20 and speakers 22, respectively. Application program 24 may be a computer game, or virtually any other type of program that utilizes a physics engine 26 that simulates real-time rigid body dynamics in response to user inputs and program logic.

Application program 24 is configured to utilize and processor 12 is configured to execute a physics engine 26 to simulate the real-time rigid body dynamics of a simulated physical system including a plurality of bodies. Data representing these physical bodies is stored as world data 28 and user data 30. It will be appreciated that physics engine 26 is provided with permissive penetration functionality, described in detail herein. At a high level, the physics engine includes collision detection logic 32, solving logic 34, and a kinematic integrator 36, which are applied iteratively by the physics engine 26 to adjust the positions and velocities of various rigid bodies in the physical system, in order to make them behave appropriately under applied forces, such as gravity, wind resistance, springs, magnetism, etc., as well as observe physical constraints, such as non-penetration of other rigid bodies, joint constraints, etc. Collision detection logic 32, solver logic 34, and kinematic logic 36 are typically software programs executed by the processor 12, which may be a multi-threaded and possibly multi-core central processing unit (CPU). However, in some embodiments portions or all of the logic of the physics engine 26 described herein may be implemented in firmware or hardware, for example on a graphical processing unit (GPU).

Figure 2:
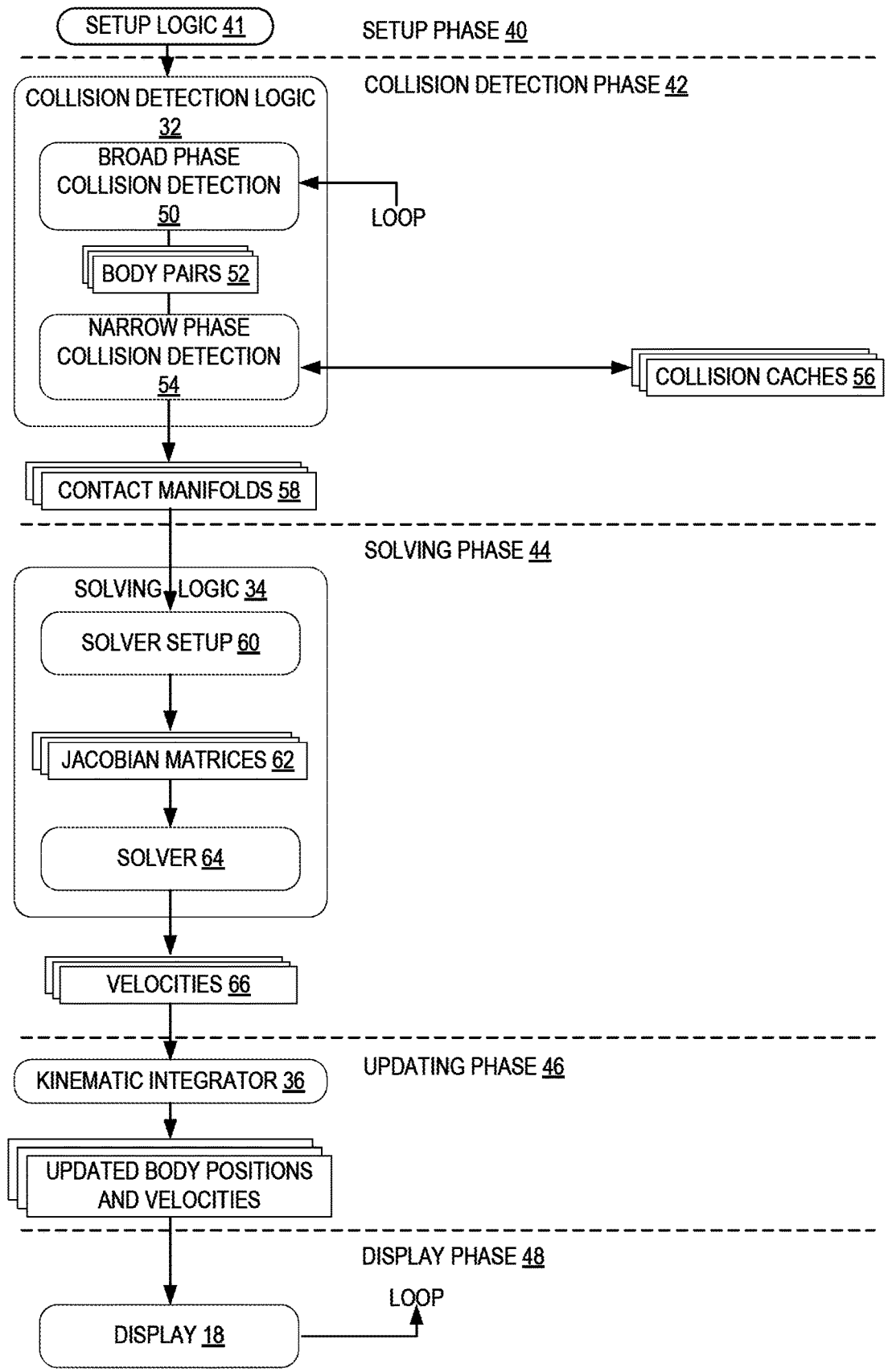
FIG. 2 shows a process flow that may be implemented by the computing device of FIG. 1 for substantially enforcing non-penetration constraints.

FIGS. 2-5 illustrate a real-time rigid body simulation by the physics engine 26, which substantially enforces non-penetration of bodies in the system. As shown in FIG. 2, the simulation begins with a setup phase 40 implemented by setup logic 41 executed on processor 12, in which the objects and their positions, orientations and velocities are initially set prior to kinematic simulation. Following the setup phase 40, the simulation enters into a loop, during which a collision detection phase 42 and a solving phase 44 are iteratively executed by the collision detection logic 32 and solving logic 34 respectively. During the collision detection phase 42, contact information for touching bodies is generated, and during the solving phase 44 the system of body velocities and constraints imposed by contacts are computed. At the end of the solving phase 44, the forces are applied to the bodies. The positions and velocities of the bodies are updated in an updating phase 46. The results (i.e., a graphical representation of the updated positions of the bodies) are displayed in a display phase 48. Once the results are displayed, the process loops back to the collision detection phase 42. These phases will now be explained in more detail.

Collision Detection

The collision detection phase 42 generates contact points between any touching or nearly touching rigid bodies. Typically, this is done by a broad collision detection phase 50 which finds pairs 52 of potentially colliding bodies, then a narrow collision detection phase 54 which generates contact information for each pair 52 and stores it in a collision manifold 58, which is a data structure designed to hold data regarding each collision between a pair of bodies 52. The contact information stored in the collision manifold 58 may include a separating normal vector, any number of contact point positions and their penetrating or separating distances (i.e., the positive (separating) or negative (penetrating) distances between the pair of bodies 52 at the point of contact). In order to optimize collision detection, some narrow phase working data is cached in collision caches 56 and reused in subsequent simulation steps.

Solving Constraints

The solving phase 44 implemented by solver logic 34 first creates a set of mathematical constraints (known as Jacobian matrices or simply Jacobians) based on the generated contact manifolds. Solver setup 60 involves converting the position and velocity data for the rigid bodies into Jacobian matrices 62, which can be processed in a computationally efficient manner in real time by the solver 64. The constraints are velocity-based, meaning that they are constraints on the velocities of the two contacting bodies. The solver 64 then solves for all the body velocities 66 and constraints and finally applies the resulting impulses or forces back to the bodies.

In real-time physics engines such as physics engine 26, it is typically too computationally expensive to solve an unbounded system of constraints simultaneously, so instead an iterative algorithm is employed by the solver 64, such as the Projected Gauss Seidel (PGS) algorithm. Instead of solving all constraints at once, PGS solves each constraint in turn, repeating the process several times, so that the solver 64 converges towards to a stable solution. It will be appreciated that other algorithms may also be used instead of PGS, such as modified versions of the PGS, the Jacobi method, etc.

This style of solving does not actually solve the system of equations, but rather finds an approximation of a solution. Thus, the relative velocity of objects will never reach zero. Consider stacked objects under the influence of gravity only, for example. Such stacked objects will, as a result of the approximations computed by the PGS algorithm, have velocities that never reach zero, but instead slowly cause the objects to start to sink into each other.

Handling Penetrations

It is expected that bodies will penetrate during rigid-body simulation, due to the imperfect nature of iterative solving and due to accumulated numerical precision errors. When bodies are penetrating, contact points generated between them have a negative distance. To get good stability of such an iterative solver, those penetrations have to be solved in a very short time, ideally a single simulation frame (i.e., timestep). If they are solved over many (e.g. >10) simulation frames, the solver becomes very soft and objects will start penetrating visually.

Physics engine 26 may adopt one of two basic solutions to solve penetrations: velocity adjustment or position adjustment. Adjusting the relative velocity may be achieved by modifying a contact constraint equation by introducing a velocity bias. This bias may be set proportional to the penetration depth, employing a technique known as Baumgarte stabilization. For example, the bias may be set to solve a proportional fraction such as 60% (or other percentage) of the penetration depth every solver step.

Although not illustrated in FIG. 2, adjusting the relative position may alternatively be achieved by running a post-processing algorithm after the solver completes its calculations which repositions the pair of objects in three dimensional game space, rather than in solver space which handles the Jacobian constraint matrices. The repositioning is done iteratively, such that each pair of objects is solved independently and sequentially.

Figure 3:
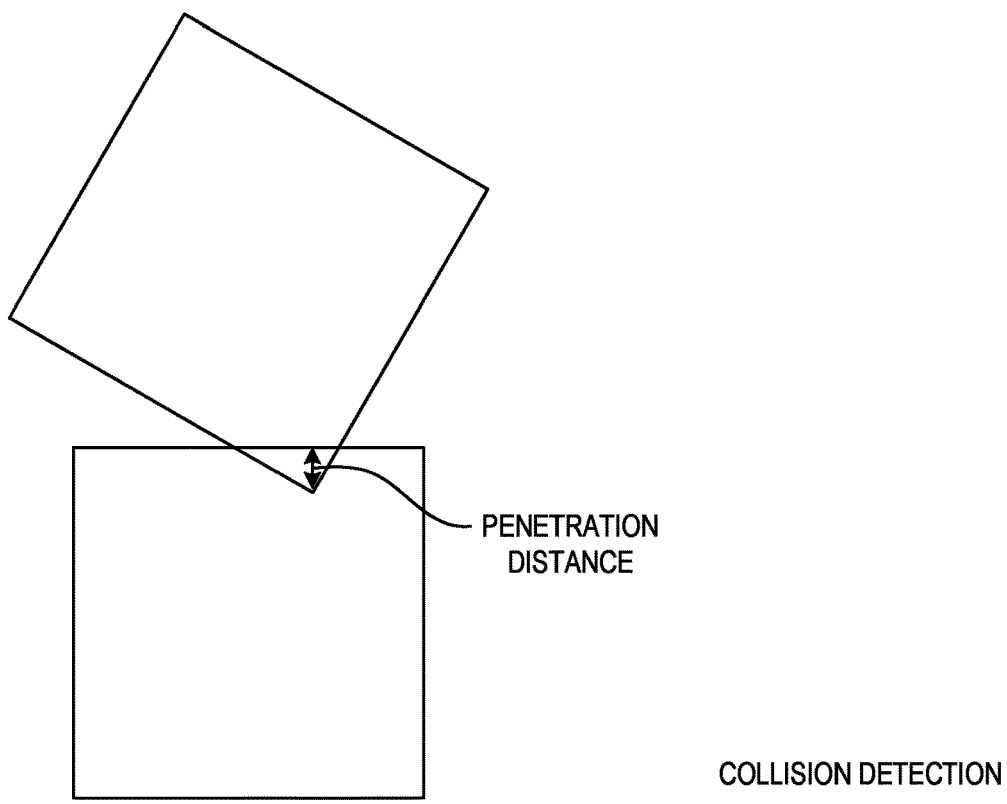
FIGS. 3 and 4 are simplified diagrams of a pair of colliding bodies, showing collision detection and application of a velocity proportional to a total penetration distance to the penetrating body in order to resolve penetration.
Figure 4:
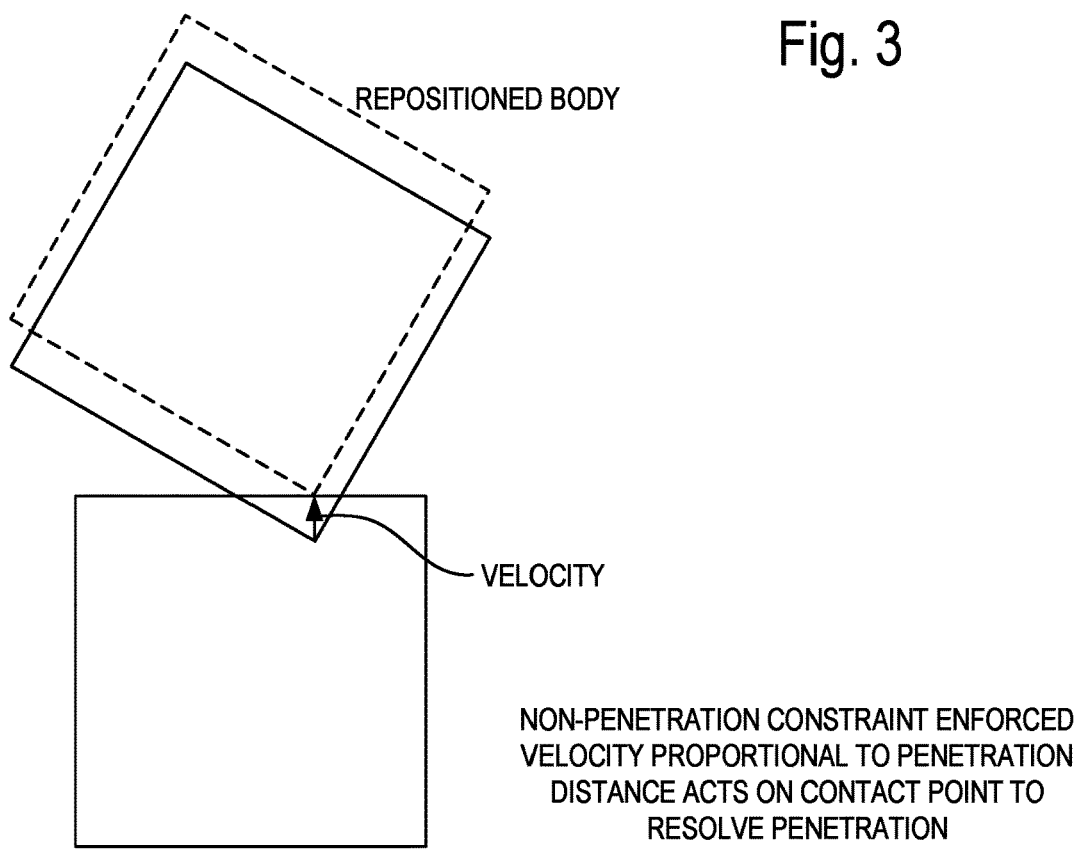

FIGS. 3 and 4 illustrate repositioning a pair of colliding bodies by the process for substantially enforcing non-penetration constraints illustrated in FIG. 2. In FIG. 3, a pair of bodies is illustrated, with a first body penetrating a second body by a second body by a total penetration distance, a collision that would be detected by collision detection phase 42 of FIG. 2. FIG. 4 illustrates how the solver 64 calculates a velocity at the point of contact proportional to the total penetration distance and applies the velocity to the penetrating first body in order to substantially resolve penetration and enforce the non-penetration constraint. Once the velocity is applied, the kinematic integrator would reposition the first body to the position shown in dashed lines, which is substantially non-penetrating.

Figure 5:
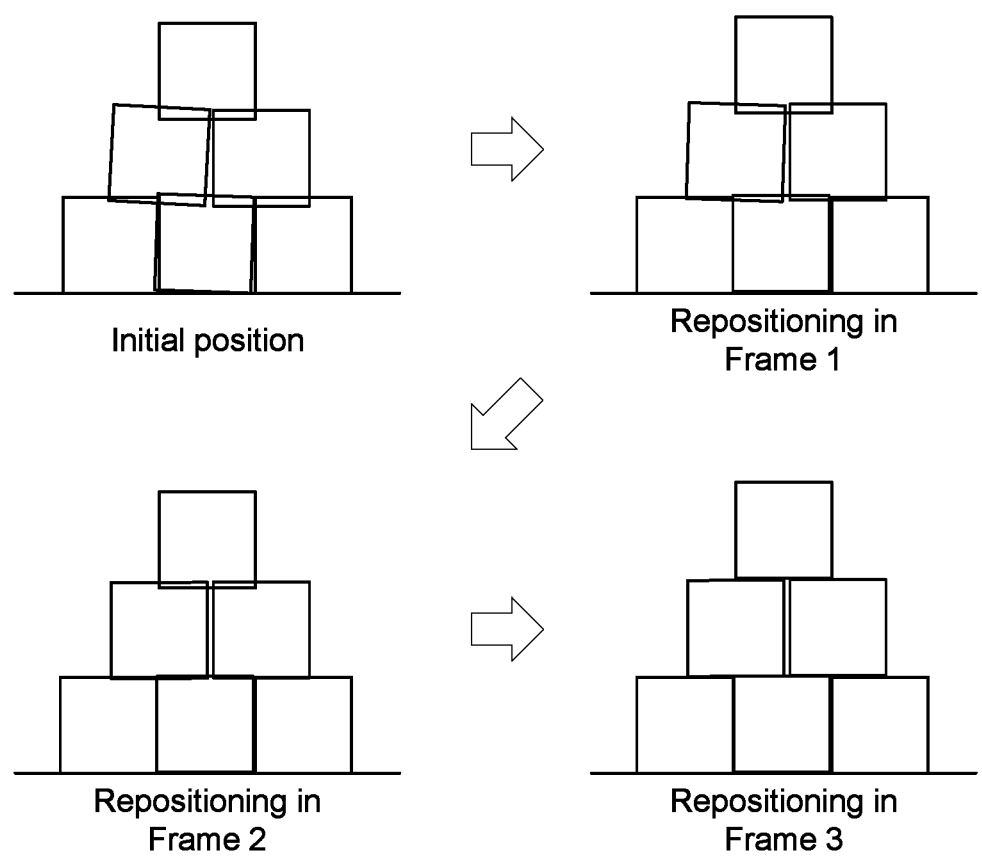
FIG. 5 illustrates a series of frames over which bodies are repositioned to substantially enforce non-penetration constraints among a plurality of bodies.

FIG. 5 illustrates repositioning multiple stacked bodies by the process for substantially enforcing non-penetration constraints illustrated in FIG. 2. In the upper left, the bodies are shown in an initial position in which the bodies penetrate each other. Repositioning in frames 1, 2, and 3 is shown with the bodies slowly being pushed out of penetration conditions with each other as the solver iteratively solves its equations to substantially enforce non-penetration, until all of the bodies appear to be non-penetrating.

The phenomenon shown in FIG. 5, by which stacked bodies are pushed out from each other over a series of frames during simulation, can have negative practical effects in some situations. For example, a person who places content into simulated environments, such as a computer artist placing content in a computer game, etc., may be frustrated when the object placed moves out of the position in which it was placed. The computer artist may be forced to reposition the object, and possibly investigate whether the change in position was caused by a collision bounding box being differently shaped than a mesh (visible rendered surface) of the object. When placing hundreds of thousands of bodies in a virtual environment, the need to replace or investigate the causes of the simulator moving placed objects can consume unneeded hours of the artist's time. Further, computer processing resources and memory are consumed by the repositioning, which can slow the entire simulation down, or cause the simulation to take processing shortcuts which run the simulation on geometries of reduced complexity.

In addition, in some situations the geometry of a body may change during the simulation. This may occur, for example, when using an adaptive simulator that can change the body geometry and/or collision bounding box geometry in real time based upon available computational resources, thus using simpler geometries when fewer computational resources are available, for example when a large number of objects are being simulated concurrently. When a geometric substitution such as this is made the geometry of the new representation of the body will naturally slightly differ from the prior representation of the body. This may cause, for example, a penetration condition between two bodies to exist where none had existed in a prior frame. In such a case, if non-penetration is substantially enforced as described above, in the frames following substitution, the newly colliding objects will begin to separate. This may cause movement during a simulation without any apparent cause to the viewer, degrading the viewer experience.

Figure 6:
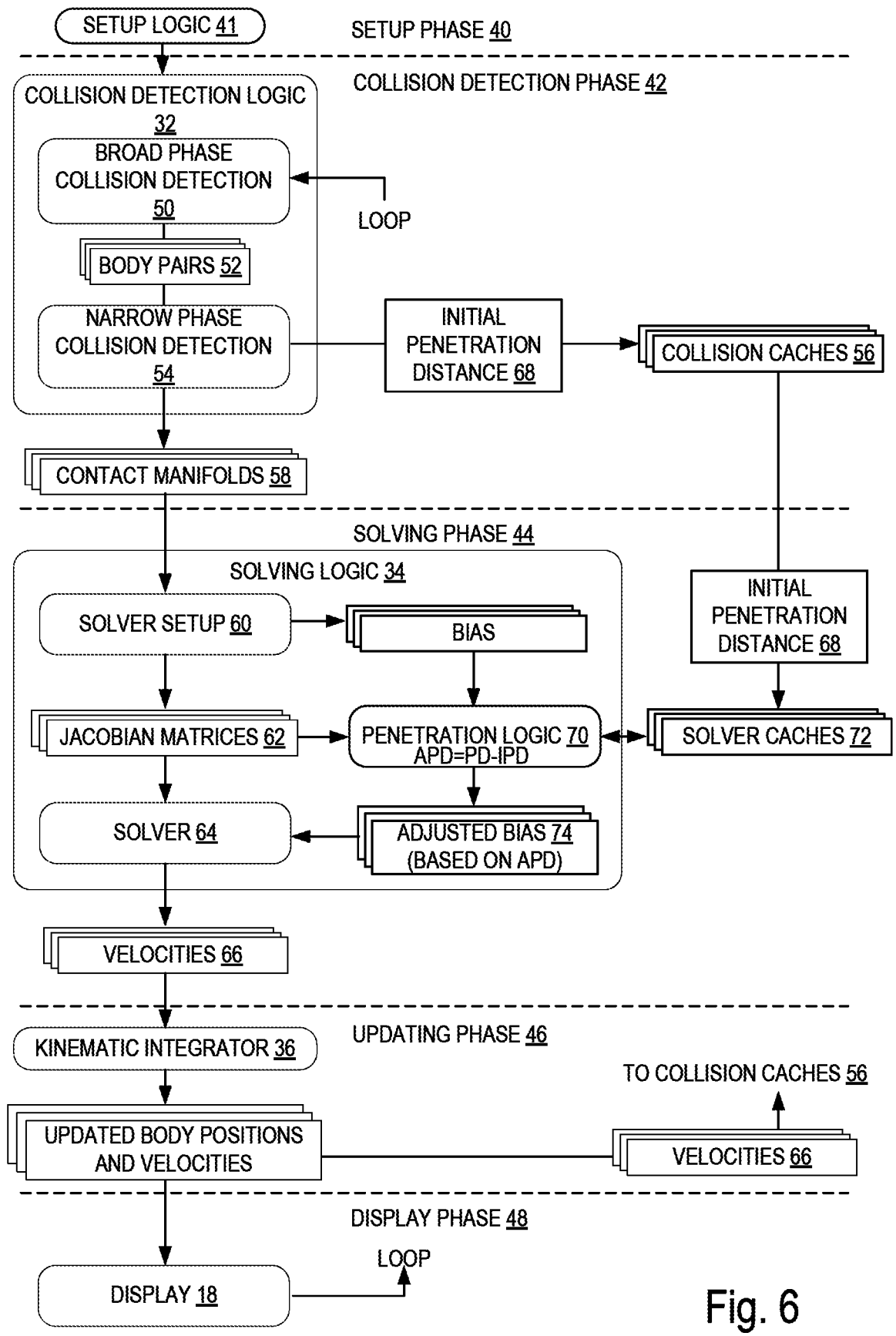
FIG. 6 is a schematic diagram illustrating a process flow executed by the solver of the physics engine of FIG. 1, by which the solver iteratively solves kinematic equations over a series of frames (i.e., timesteps) to substantially enforce non-penetration constraints between a pair of rigid bodies while permitting penetration in each current frame substantially as deep as an initial penetration distance from a prior frame.

To address these drawbacks, the physics engine 26 of the computing device 10 of the present disclosure is provided with permissive penetration functionality, as illustrated and described with reference to FIGS. 6-10. Referring firstly to FIG. 6, the illustrated setup phase 40, collision detection phase 42, constraint solving phase 44, updating phase 46, and display phase 48 are similar to that described above with relation to FIG. 4, except as described differently below.

In the step up phase 40, set up logic 41 sets initial values for the position, orientation, and velocity for the plurality of bodies in the physical simulation, in three dimensional space of the simulation environment (e.g., game space). The physics engine 26 then iteratively loops through a collision detection phase 42, solving phase 44, updating phase 46, and display phase 48, as shown. The phases occur iteratively, and the terms "current" and "prior" are used herein to refer to phases that occur in a current frame (i.e., timestep) or prior frame. Thus, for a given time t, the current collision detection phase and the current solving phase belong to a current frame at time t, and the prior collision detection phase and the prior solving phase belong to a prior frame occurring immediately before the current frame, at time t−1. There may be situations in which looking back more than one frame may be desirable, and in those situations a "prior" frame may refer to a frame at time t−2, for example.

In the current collision detection phase 42, broad phase collision detection 50 is performed to identify colliding pairs 52 of bodies of the plurality of bodies. Next, narrow phase collision detection 54 is performed for each identified pair 52, to determine that a penetration exists between the pair of bodies, and to determine the initial penetration distance 68 for each body pair 52. The initial penetration distance 68 for each pair 52 of bodies is written by the collision detection logic 32 to the collision cache 56 for that pair 52 of bodies. The initial penetration distance 68 stored in this manner will be treated as an allowed penetration distance by the solving logic 34 in a subsequent frame. The collision detection logic 32 may also write the points of contact between the pair 52 of bodies, and the velocities of each body of the pair 52 to the collision cache 56, as well as the surface normal vector (a unit normal vector orthogonal to the surface of the penetrated body). Contact manifolds 58 are computed for each pair 52 of bodies by the collision detection logic, and passed to the solving logic 34.

In turn, the solving logic 34 runs an initial solver setup 60 in which the contact manifolds are converted from 3D space into solver space, by computing Jacobian matrices for the contact manifold 58 for each pair 52 of colliding bodies.

In each current solving phase 44, for each pair 52 of bodies for which contact manifolds 58 are produced, penetration logic 70 of the solving logic 34 determines whether a penetration between the pair 52 of bodies is due to an initial penetration between the pair of bodies by comparing the total penetration distance (TPD) to the initial penetration distance stored in the collision cache. To account for small variations in the iterative solving process, a threshold tolerance may be applied to this determination. Thus, if the total penetration distance is within a threshold tolerance of the initial penetration distance (IPD) 68 (i.e., absolute value (TPD−IPD)<threshold), then the total penetration distance is deemed to be due to the initial penetration.

When the penetration is due to an initial penetration from a prior collision detection phase, the penetration logic 70 is configured to permit the initial penetration between the pair of objects during the current solving phase by not applying a bias to correct for the initial penetration. In some implementations, if the value of the total penetration distance is found to be smaller than the value of the initial penetration distance, then the initial penetration distance is set to the value if the total penetration distance. This enables the allowed penetration to be reduced over time as the objects naturally separate. By convention, penetration distances are positive, while separation distances are negative.

The penetration logic also predicts the current penetration distance for the currently considered pair 52 of bodies based on the total penetration distance from a prior frame, the contact point positions and normal vectors from a prior or current frame and the distance the bodies moved between the prior and the current frame. The total penetration distance from the prior frame is typically read from the collision cache for the pair of bodies. In normal situations this predicted penetration distance (PPD) should be nearly identical to the total penetration distance (TPD) calculated by the collision detector.

Further, in some implementations, if the total penetration distance for the current frame is found to be much larger (i.e., greater than a threshold larger) than the predicted penetration distance (PPD), then the physics engine 26 may determine that the change is due to a geometry change, as explained below in relation to FIG. 10. In such a case, the physics engine may increase the value of the initial penetration distance by the difference between the total penetration distance and the predicted penetration distance (e.g., IPD=IPD+(TPD−PPD)). In this way, the permissive penetration treatment described herein may be applied to changes of mesh geometry.

On the other hand, when the penetration is not due to an initial penetration from a prior collision detection phase (i.e., the outcome of the above comparison is false), the penetration logic 70 is configured to apply a bias (or calculate a position change if operating in three dimensional space) for at least one of the bodies as an estimated correction for the penetration. As used herein, "bias," refers to a velocity vector (i.e., an impulse velocity) applied by the solving logic computed by the solving logic to be added in the current frame to influence the movement of a rigid body. Turning briefly for illustration to FIGS. 7-8, the penetration logic 70 may accomplish this by calculating a total penetration distance TPD between the pair of bodies in the current solving phase of the current frame (e.g., in FIG. 8), read an initial penetration distance (IPD) for a prior collision phase (typically the immediately prior frame at t−1, where t is the current timestep) for the pair of bodies (e.g., the IPD from the prior frame in FIG. 7). The initial penetration distance may be read from directly or indirectly from the collision cache 56 written during the prior frame, as shown in FIG. 6. It might be appreciated that the solving logic 34 maintains its own solver caches 72, with representations in solver space, and thus the initial penetration distance 68 may be transmitted and stored in the solver cache 72 in solver space form, or in three dimensional space representation.

Returning to FIG. 8, the penetration logic may further be configured to calculate an additional penetration distance (APD) by subtracting the initial penetration distance (IPD) from the total penetration distance (TPD). Finally, the penetration logic may be configured to compute an adjusted bias 74 proportional to the additional penetration distance. Alternatively, outside of solver space, the adjustment in position may be made in three dimensional space, and thus a post processing algorithm may compute a position change in three dimensional space rather than a velocity bias in solver space.

As discussed above, the collision cache may additionally include data for the contact points written during the prior collision phase and velocities of the pair of rigid bodies written by the prior integration phase (prior body velocity PBV). The penetration logic may be configured to predict the total penetration distance in the current solving phase 44 based on the prior body velocity (PBV) and the total penetration distance from the prior timestep retrieved from the collision cache, and based on contact points between the pair of bodies from either the prior or current collision detection phase. The body velocity is typically calculated by the kinematic integrator during the updating phase of each loop and stored in the collision cache 56 for the pair of bodies.

The predicted penetration distance may be computed by the following formula:

$$\text{predictedPentrationDistance}(t) = \text{totalPenetrationDistance}(t-1) + M(t-1) * \text{velocity}(t-1);$$

wherein t is a timestep;

M is a matrix which projects velocities onto distance changes; and

M is calculated from the contact point position and normal, velocity vector, the center of mass of both bodies and the delta time between timesteps.

Following the computation of the adjusted bias 74, the solver 64 computes velocities 66 for the current frame, based on the adjusted biases 74 received from the penetration logic 70, as well as based on the Jacobian matrices 62 received from the solver setup 60.

Following computation of the velocities 66, in an updating phase 46, the physics engine 26 may be configured to reposition the bodies based on the velocities 66, which in turn have been computed based upon the applied adjusted bias (or position change) computed by the penetration logic 70. This is typically accomplished by the kinematic integrator 36, which reads the velocities 66, and updates the body positions and velocities for each of the bodies in the physical system.

Figure 7:
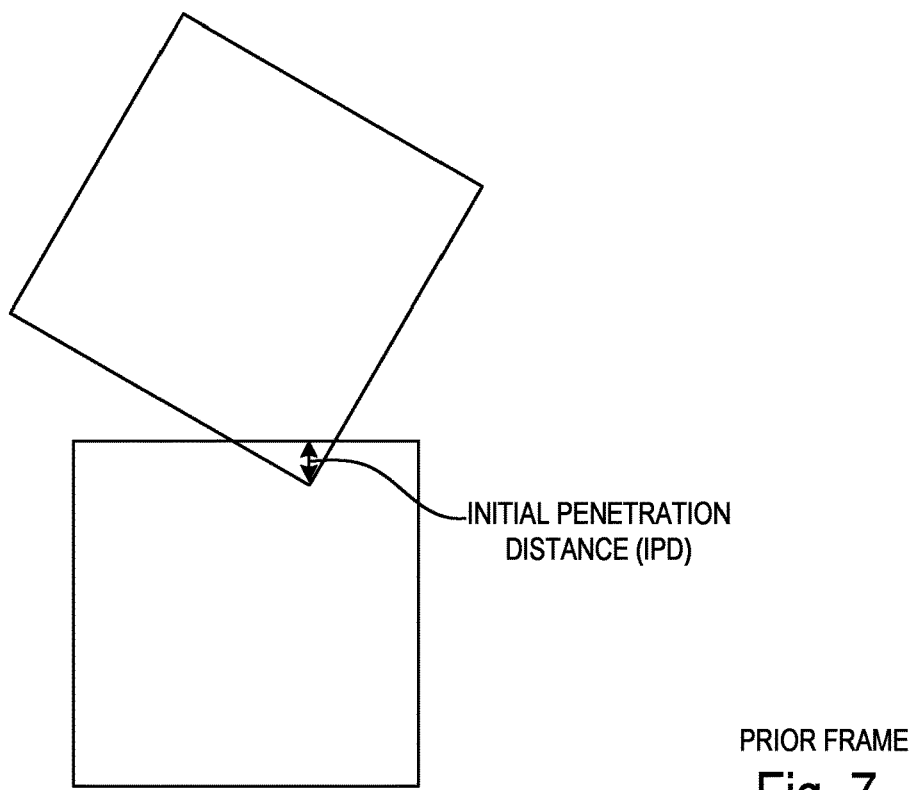
FIGS. 7 and 8 are simplified diagrams of a pair of colliding bodies, showing collision detection, determination of an initial penetration distance in a prior frame, prediction of a total current penetration distance in a current frame, and application of a velocity proportional to an additional penetration distance equal to the total current penetration distance less the initial penetration distance, to thereby permit penetration of the initial penetration distance but resolve penetration of the additional penetration distance.
Figure 8:
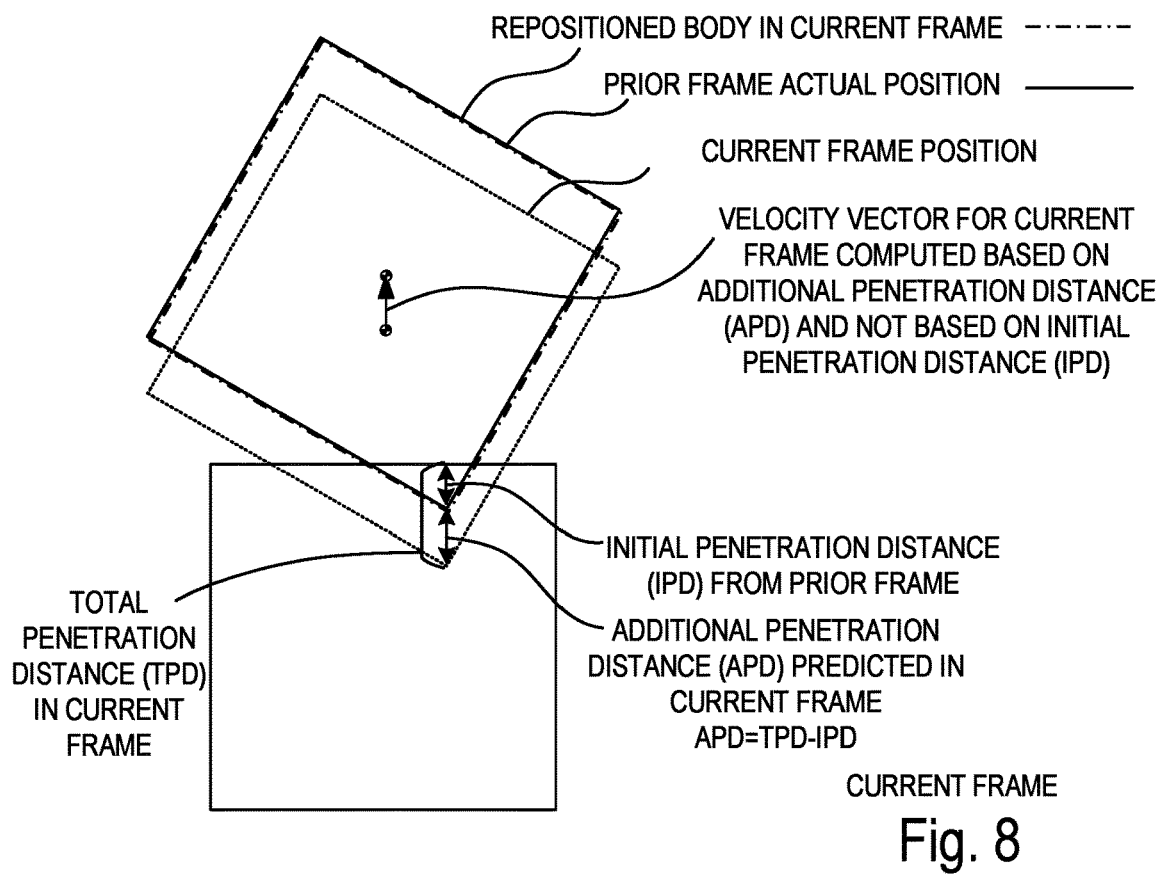

In FIG. 8, the dashed line represents the location of the penetrating body at the total penetration distance for the current frame, and the dot dashed line represents the repositioned body, which is substantially adjacent the actual position of the body in a prior frame (i.e., the position shown in FIG. 7) but still penetrates by the initial penetration distance. The penetrating body is caused to be repositioned at the dot-dash line by the application of a velocity vector at the center of mass of the body, the velocity vector being normal to the surface of the penetrated body and proportional in magnitude to the additional penetration distance (APD) and not based on the initial penetration distance (IPD).

Lastly, in a display phase 48, the physics engine may be configured to output data representations of the plurality of bodies including the at least one repositioned body to display 18 associated with the computing device.

It should be appreciated that the penetration logic 70 is typically configured to perform its calculations in three dimensional space, since the data for the initial penetration distance, contact points, and velocities from the collision detection phase in the collision caches 54 is typically represented in three dimensional space. Thus, the penetration logic typically converts the Jacobian matrix data and bias data to a three dimensional space representation in order to compute the predicted penetration distance and additional penetration distance in the manner described above. Alternatively, for the purposes of speeding computation, the penetration logic could convert the initial penetration distance and contact points from the collision caches into Jacobians and constraint biases in order to perform the operations in solver space. In such an alternative implementation, during the current solving phase, the penetration logic 70 may be further configured to use the penetration depth calculated by the collision phase as the total penetration distance between the pair of bodies in the current solving phase, read a Jacobian matrix and constraint biases for the prior collision phase for the pair of bodies, calculate an additional penetration distance by subtracting the initial penetration distance from the total penetration distance, and compute constraint biases proportional to the additional penetration distance.

In another implementation, M(t−1) may be replaced with M(t) in the above discussed penetration calculation. The benefit of such an approach is that there is no need to store the contact points (or Jacobians if we use the previous optimization) in the collision cache, saving memory and processing time for retrieval. In addition, any quality drawbacks are expected to be limited to relatively minor artefacts with such an approach, since contact points move relatively smoothly during simulation.

Figure 9:
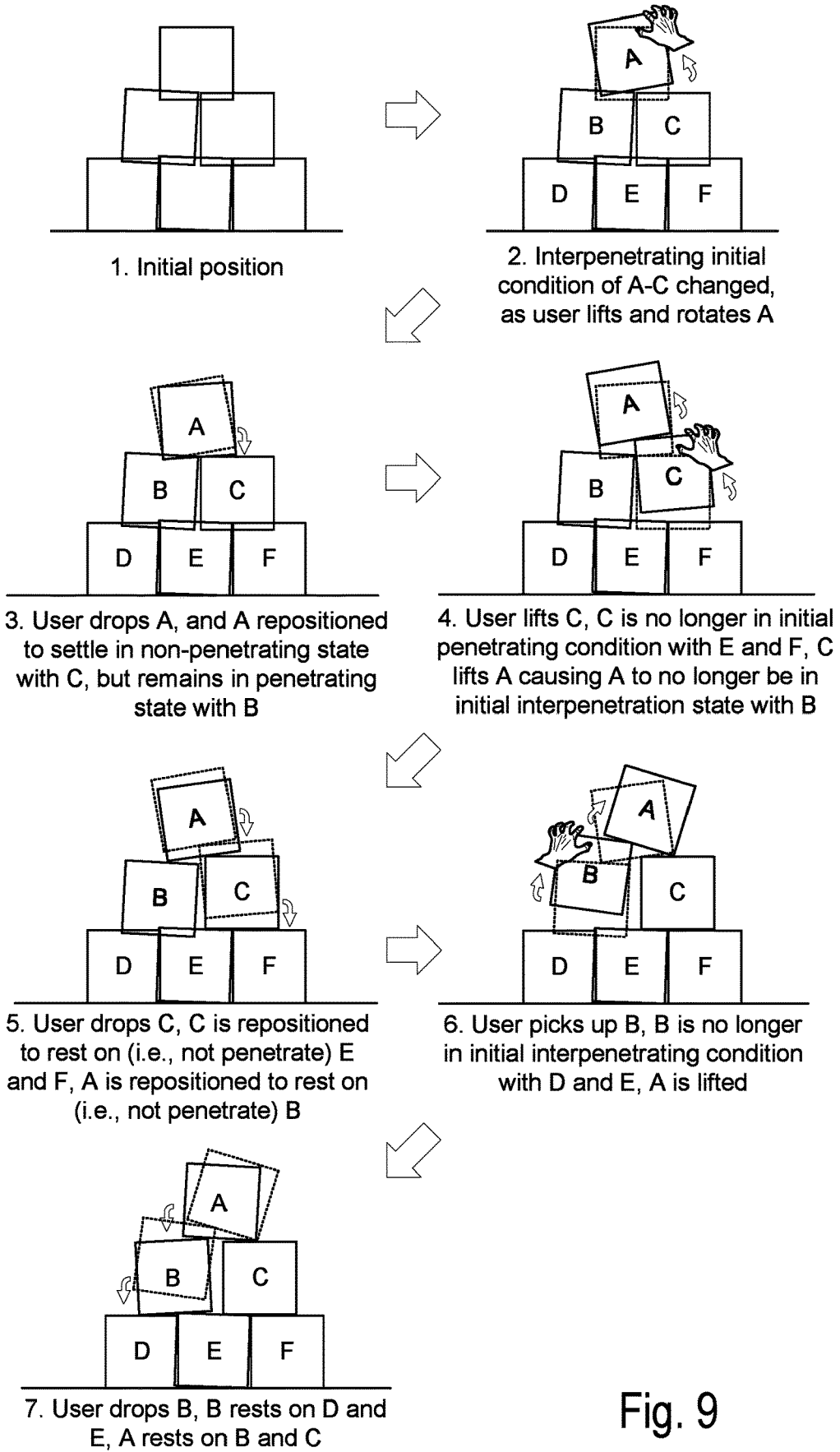
FIG. 9 illustrates a series of frames over which a user interacts with bodies, which are repositioned to substantially enforce non-penetration constraints between pairs of bodies among a plurality of bodies, while permitting penetration among the pairs of bodies to an extent of an initial penetration distance in a prior frame.

Turning now to FIG. 9, the behavior of a plurality of stacked rigid bodies under simulation using the permissive penetration functionality of FIGS. 6-8 is illustrated. At 1, in the initial position the bodies interpenetrate each other. At 2, the initial conduction of bodies A-C is changed as a user lifts and rotates body A. At 3, the user drops body A and body A is repositioned to settle in a non-penetrating state with body C under the influence of simulated gravity, but remains in a penetrating state with body B. At 4, the user lifts body C, and body C is no longer in the initial penetrating condition with body E and body F. Body C lifts body A causing A to no longer be in an initially penetrating state with body B. At 5, the user drops body C, and body C is repositioned to rest on and not penetrate body E and body F, while at the same time body A is repositioned to rest on and not penetrate body B under the influence of gravity. At 6, the user picks up body B and body B is no longer in an interpenetrating condition with body D and body E, and further body A is lifted. Lastly, at 7, the user drops body B and body B comes to rest on body D and body E, while body A rests on body B and body C. In this state, body D and body E are still in their initial interpenetration condition, but the remaining bodies are not, and non-penetration is enforced among the remaining bodies. By enabling the interaction of a user with placed bodies in a simulation as shown in FIG. 9, the drawbacks associated with slight movements due to non-penetration constraints being enforced during content creation discussed above can be avoided, and a content creator, such as a computer game artist, can place objects and adjust their positions without modifying their geometries and without the physics engine causing small movements among objects that slightly penetrate each other as shown in FIG. 5, saving time and avoiding re-work during content creation.

Figure 10A:
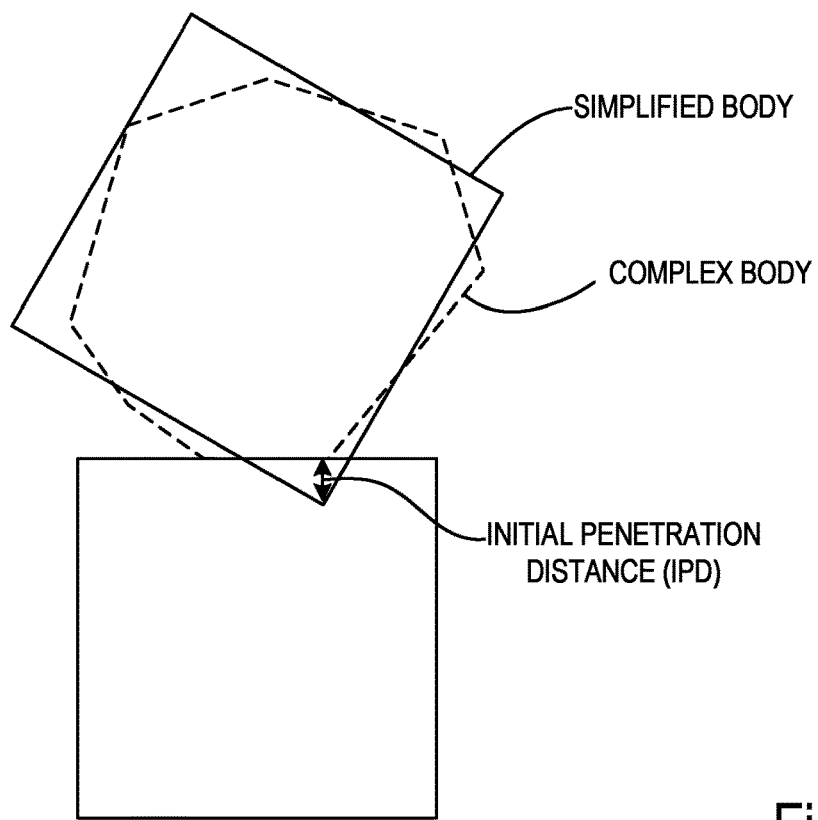
FIG. 10A is an illustration of an initial penetration condition caused by a change in body geometry from a complex body to a simplified body.
Figure 10B:
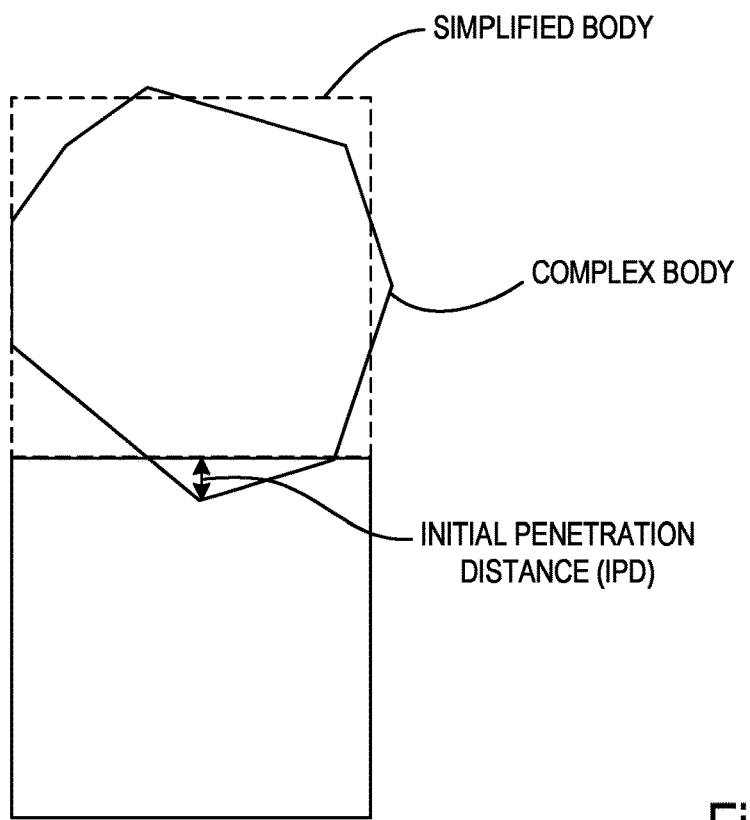
FIG. 10B is an illustration of an initial penetration condition caused by a change in body geometry from a simplified body to a complex body.

FIG. 10A illustrates a scenario discussed briefly above in which the physics engine 26 converts a more complex body into a simplified body for the purposes of saving processor cycles, memory, or other computing resources during simulation. Although the more complex body illustrated in dashed lines did not penetrate the other body, the simplified body shown in solid lines does penetrate the other body. Thus, the change in body geometry caused a penetration condition to occur. Physics engine 26 accounts for such a scenario by, in the frame following the replacement of a body with another body of modified geometry, recording the penetration as a total penetration distance in the collision cache during the collision detection phase of the iterative solver, and in a subsequent solving phase permitting penetration to the extent of the initial penetration distance. This may be accomplished, as described above, by determining that the total penetration distance for the current frame is found to be much larger (i.e., greater than a threshold larger) than the predicted penetration distance, and then increasing the value of the initial penetration distance by the difference between the predicted penetration distance and the total penetration distance (e.g., IPD=IPD+(TPD−PPD)). In this way, physics engine will not attempt to substantially enforce a non-penetration constraint on a pair of bodies in the event that a change in body geometry due under such circumstances causes penetration to occur. As a result, the viewer will not experience movement of objects that have no obvious cause in these circumstances. While the above advantage is described in the context of a complex shape being made simpler, it will be appreciated that the reverse transformation, in which a simple shape is made more complex, for example when additional processor resources become available, can also cause sudden initial penetration conditions to result, as illustrated in FIG. 10B. The techniques for permitting such initial penetration conditions will have like benefits in flexibly addressing these penetrations.

Figure 11:
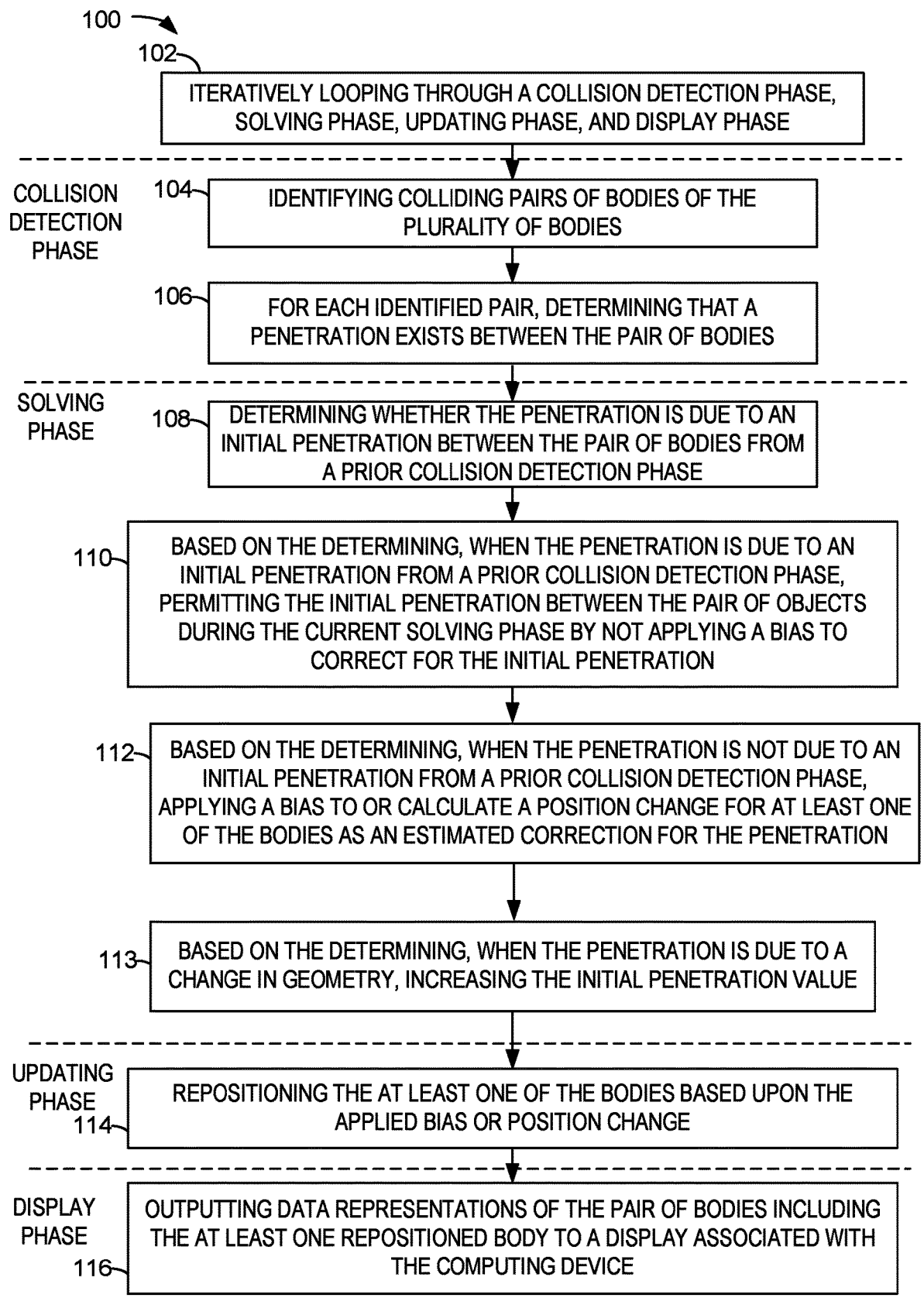
FIG. 11 is a flowchart of a method for solving rigid body dynamics with permissive penetration functionality, according to one embodiment of the present disclosure.

FIG. 11 is a flow chart of a method for use with a computing device, for solving rigid body dynamics with permissive penetration functionality. It will be appreciated that method 100 may be executed using the hardware describe above, or using other suitable hardware. For example, the method 100 may be executed at a physics engine 26 executed by a processor 12 of a computing device 10 to simulate real-time rigid body dynamics of a simulated physical system including a plurality of bodies.

At 102, the method may include iteratively looping through a collision detection phase, solving phase, updating phase, and display phase. Steps 104-106 are executed in a collision detection phase. At 104, the method may include identifying colliding pairs of bodies of the plurality of bodies, and at 106 the method may include for each identified pair, determining that a penetration exists between the pair of bodies. Steps 108-113 are executed in a solving phase. At 108, the method may include determining whether the penetration is due to an initial penetration between the pair of bodies from a prior collision detection phase. At 110, based on the determining, when the penetration is due to an initial penetration from a prior collision detection phase of a prior frame (i.e., timestep), the method may include permitting the initial penetration between the pair of objects during the current solving phase by not applying a bias to correct for the initial penetration. At 112, based on the determining, when the penetration is not due to an initial penetration from a prior collision detection phase of a prior frame, the method may include applying a bias to or calculate a position change for at least one of the bodies as an estimated correction for the penetration. At 113, based on determining if the total penetration distance is much larger than the predicted penetration distance, the method may increase the initial penetration value.

Step 114 is executed in an updating phase. At 114, the method may include repositioning the at least one of the bodies based upon the applied bias or position change.

Step 116 is executed in a display phase. At 116, the method may include outputting data representations of the pair of bodies including the at least one repositioned body to a display associated with the computing device.

According to the method, the current collision detection phase and the current solving phase belong to a current frame, and the prior collision detection phase and the prior solving phase belong to a prior frame occurring immediately before the current frame.

During the current solving phase, the method may further include calculating a total penetration distance between the pair of bodies in the current solving phase, reading an initial penetration distance for the prior collision phase for the pair of bodies, calculating an additional penetration distance by subtracting the initial penetration distance from the total penetration distance, and computing a bias or position change proportional to the additional penetration distance.

Typically, the initial penetration distance is read from a collision cache written during the prior frame. The collision cache may additionally include a prior velocity of at least one of the pair of rigid bodies written during the prior integration phase. Further, according to the method, calculating the predicted penetration distance in the current solving phase is based on the prior velocity and the total penetration distance from the prior frame retrieved from the collision cache, and is based on contact points between the pair of bodies. The contact points may also be stored in the collision cache.

In one implementation of the method, the total penetration distance may be computed by the formula described above for predictedPenetrationDistance(t).

In another implementation, during the current solving phase, the method may include calculating a total penetration distance between the pair of bodies in the current solving phase, reading a Jacobian matrix and constraint biases for the prior collision phase for the pair of bodies, calculating an additional penetration distance by subtracting the initial penetration distance from the total penetration distance, and computing constraint biases proportional to the additional penetration distance.

According to another implementation, a method may be executed by the physics engine described herein, which includes, for each pair of bodies of the plurality of bodies identified as collision candidates, iteratively solving kinematic equations over a series of timesteps to substantially enforce non-penetration constraints between the rigid bodies in the pair while permitting penetration in each current timestep substantially as deep as an initial penetration distance from a prior timestep. The method of this implementation may further include calculating an additional penetration distance in a current timestep in addition to the initial penetration distance by which a first body of the pair penetrated a second body of the pair in a prior timestep. The method may further include applying a bias proportional to the additional penetration distance without applying a bias proportional to the initial penetration distance, to thereby permit penetration in the current timestep substantially as deep as the initial penetration distance from the prior timestep.

According to another implementation, a method executed on a physics engine as described herein is provided that includes, while iterating between detecting interpenetrating collisions between objects and repositioning objects that have been detected as interpenetrating so that they no longer interpenetrate, permitting objects that interpenetrate as their initial condition to interpenetrate without repositioning them for so long as their initial condition of interpenetration remains true. After their initial condition of interpenetration changes so that they are no longer initially interpenetrating, the method may include repositioning them following collision detection.

While the illustrative embodiments have been described using two dimensional graphics as examples for simplicity of explanation, it will be appreciated that the techniques described herein apply equally to three dimensional representations.

Figure 12:
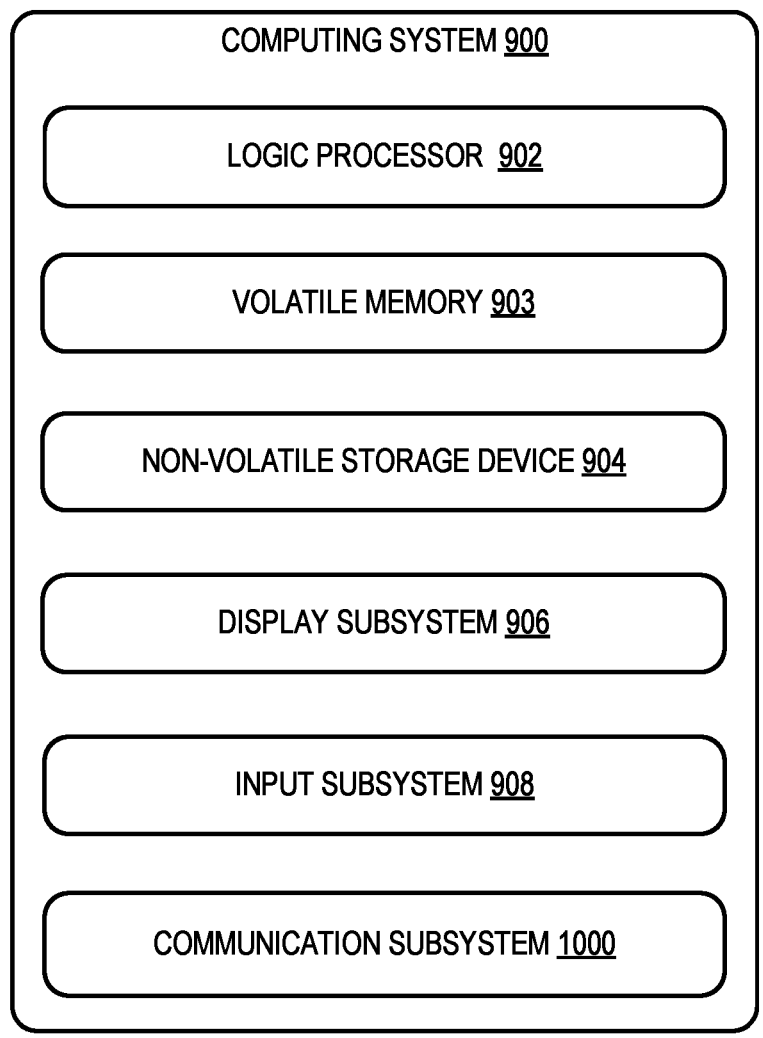
FIG. 12 is a schematic depiction of an example computer device that may be used as the computing device of FIG. 1.

FIG. 12 schematically shows a non-limiting embodiment of a computing system 900 that can enact one or more of the methods and processes described above. Computing system 900 is shown in simplified form. Computing system 900 may embody the computing device 10. Computing system 900 may take the form of one or more personal computers, server computers, tablet computers, network computing devices, mobile computing devices, mobile communication devices (e.g., smart phone), and/or other computing devices.

Computing system 900 includes a logic processor 902 volatile memory 903, and a non-volatile storage device 904. Computing system 900 may optionally include a display subsystem 906, input subsystem 908, communication subsystem 1000, and/or other components not shown in FIG. 7.

Logic processor 902 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 902 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, it will be understood that these virtualized aspects are run on different physical logic processors of various different machines.

Non-volatile storage device 904 includes one or more physical devices configured to hold instructions executable by the logic processors to implement the methods and processes described herein. When such methods and processes are implemented, the state of non-volatile storage device 94 may be transformed—e.g., to hold different data.

Non-volatile storage device 904 may include physical devices that are removable and/or built-in. Non-volatile storage device 94 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 904 may include nonvolatile, dynamic, static, read/write, read-only, sequential-access, location-addressable, file-addressable, and/or content-addressable devices. It will be appreciated that non-volatile storage device 904 is configured to hold instructions even when power is cut to the non-volatile storage device 904.

Volatile memory 903 may include physical devices that include random access memory. Volatile memory 903 is typically utilized by logic processor 902 to temporarily store information during processing of software instructions. It will be appreciated that volatile memory 903 typically does not continue to store instructions when power is cut to the volatile memory 903. One example of volatile memory 903 is random access memory (RAM).

Aspects of logic processor 902, volatile memory 903, and non-volatile storage device 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 900 that is typically software stored in non-volatile memory and implemented by a processor to perform a particular function using portions of volatile memory, which function involves transformative processing that specially configures the processor to perform the function. Thus, a module, program, or engine may be instantiated via logic processor 902 executing instructions held by non-volatile storage device 904, using portions of volatile memory 903. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 906 may be used to present a visual representation of data held by non-volatile storage device 904. The visual representation may take the form of a graphical user interface (GUI). As the herein described methods and processes change the data held by the non-volatile storage device, and thus transform the state of the non-volatile storage device, the state of display subsystem 906 may likewise be transformed to visually represent changes in the underlying data. Display subsystem 906 may include one or more display devices utilizing virtually any type of technology. Such display devices may be combined with logic processor 902, volatile memory 903, and/or non-volatile storage device 904 in a shared enclosure, or such display devices may be peripheral display devices.

When included, input subsystem 908 may comprise or interface with one or more user-input devices such as a keyboard, mouse, touch screen, microphone, camera, or game controller. When included, communication subsystem 1000 may be configured to communicatively couple various computing devices described herein with each other, and with other devices. Communication subsystem 1000 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

The following paragraphs provide additional support for the claims of the subject application. One aspect provides a computing device, comprising a processor configured to execute a physics engine to simulate real-time rigid body dynamics of a simulated physical system including a plurality of bodies, the physics engine being configured to iteratively loop through a collision detection phase, solving phase, updating phase, and display phase, in a current collision detection phase, identify colliding pairs of bodies of the plurality of bodies, for each identified pair, determine that a penetration exists between the pair of bodies, and in a current solving phase, determine whether the penetration is due to an initial penetration between the pair of bodies from a prior collision detection phase, based on the determining, when the penetration is due to an initial penetration from a prior collision detection phase, permit the initial penetration between the pair of objects during the current solving phase by not applying a bias or position change to correct for the initial penetration, and based on the determining, when the penetration is not due to an initial penetration from a prior collision detection phase, apply a bias to or calculate a position change for at least one of the bodies as an estimated correction for the penetration, in an updating phase, reposition the at least one of the bodies based upon the applied bias or position change, and in a display phase output data representations of the pair of bodies including the at least one repositioned body to a display associated with the computing device. In this aspect, additionally or alternatively, the current collision detection phase and the current solving phase may belong to a current frame, and the prior collision detection phase and the prior solving phase may belong to a prior frame occurring immediately before the current frame. In this aspect, additionally or alternatively, during the current solving phase, the processor may be further configured to calculate a total penetration distance between the pair of bodies in the current solving phase, read an initial penetration distance for the prior collision phase for the pair of bodies, wherein the initial penetration distance may be read from a collision cache written during the prior frame, calculate an additional penetration distance by subtracting the initial penetration distance from the total penetration distance, and compute a bias or position change proportional to the additional penetration distance. In this aspect, additionally or alternatively, the collision cache may additionally include a prior velocity of at least one of the pair of rigid bodies written by a kinematic integrator during a prior updating phase and the total penetration distance of a prior collision phase. In this aspect, additionally or alternatively, the processor may be configured to predict the total penetration distance in the current solving phase based on the prior velocity and the prior penetration distance from the prior frame retrieved from the collision cache, and based on contact points between the pair of bodies. In this aspect, additionally or alternatively, the processor may be configured to detect geometry changes by comparing the predicted penetration distance to the total penetration distance. In this aspect, additionally or alternatively, the processor may be configured to modify the initial penetration distance if a geometry change is detected. In this aspect, additionally or alternatively, the contact points may also be stored in the collision cache. In this aspect, additionally or alternatively, the predicted penetration distance may be calculated by a formula, predictedPenetrationDistance(t)=_totalPenetrationDistance(t−1)+M(t−1)*velocity(t−1), wherein t may be a timestep, M may be a matrix which projects velocities onto distance changes, and M may be calculated from a delta time between the timesteps, contact point position and normal vector, and a center of mass of the at least one of the bodies. In this aspect, additionally or alternatively, during the current solving phase, the processor may be further configured to calculate a total penetration distance between the pair of bodies in the current solving phase, read a Jacobian matrix and constraint biases for the prior collision phase for the pair of bodies, calculate an additional penetration distance by subtracting the initial penetration distance from the total penetration distance, and compute constraint biases proportional to the additional penetration distance.

Another aspect provides a method for use with a computing device, comprising, at a physics engine executed by a processor of the computing device to simulate real-time rigid body dynamics of a simulated physical system including a plurality of bodies, iteratively looping through a collision detection phase, solving phase, updating phase, and display phase, in a current collision detection phase, identifying colliding pairs of bodies of the plurality of bodies, for each identified pair, determining that a penetration exists between the pair of bodies, and in a current solving phase, determining whether the penetration is due to an initial penetration between the pair of bodies from a prior collision detection phase, based on the determining, when the penetration is due to an initial penetration from a prior collision detection phase, permitting the initial penetration between the pair of objects during the current solving phase by not applying a bias or position change to correct for the initial penetration, and based on the determining, when the penetration is not due to an initial penetration from a prior collision detection phase, applying a bias to or calculate a position change for at least one of the bodies as an estimated correction for the penetration, in an updating phase, repositioning the at least one of the bodies based upon the applied bias or position change, and in a display phase, outputting data representations of the pair of bodies including the at least one repositioned body to a display associated with the computing device. In this aspect, additionally or alternatively, the current collision detection phase and the current solving phase may belong to a current frame, and the prior collision detection phase may belong to a prior frame occurring immediately before the current frame. In this aspect, additionally or alternatively, during the current solving phase, the method may further comprises calculating a total penetration distance between the pair of bodies in the current solving phase, reading an initial penetration distance for the prior collision phase for the pair of bodies, wherein the initial penetration distance is read from a collision cache written during the prior frame, calculating an additional penetration distance by subtracting the initial penetration distance from the total penetration distance, and computing a bias or position change proportional to the additional penetration distance. In this aspect, additionally or alternatively, the collision cache may additionally include a prior velocity of at least one of the pair of rigid bodies written by a kinematic integrator during an updating phase and the total penetration distance from a prior collision detection phase. In this aspect, additionally or alternatively, calculating the predicted penetration distance in the current solving phase may be based on the prior velocity and the penetration distance from the prior frame retrieved from the collision cache, and may be based on contact points between the pair of bodies. In this aspect, additionally or alternatively, the contact points may also be stored in the collision cache. In this aspect, additionally or alternatively, the predicted penetration distance may be calculated by a formula, predictedPenetrationDistance(t)=totalPenetrationDistance(t−1)+M(t−1)*velocity(t−1), wherein t may be a timestep, M may be a matrix which projects velocities onto distance changes, and M may be calculated from a delta time between the timesteps, contact point position and normal vector, and a center of mass of the at least one of the bodies. In this aspect, additionally or alternatively, during the current solving phase, the processor may be further configured to calculate a total penetration distance between the pair of bodies in the current solving phase, read a Jacobian matrix and constraint biases for the prior collision phase for the pair of bodies, calculate an additional penetration distance by subtracting the initial penetration distance from the total penetration distance, and compute constraint biases proportional to the additional penetration distance.

Another aspect provides a method for use with a computing device, comprising, at a physics engine executed by a processor of the computing device to simulate real-time rigid body dynamics of a simulated physical system including a plurality of bodies, for each pair of bodies of the plurality of bodies identified as collision candidates, iteratively solving kinematic equations over a series of timesteps to substantially enforce non-penetration constraints between the rigid bodies in the pair while permitting penetration in each current timestep substantially as deep as an initial penetration distance from a prior timestep. This aspect, additionally or alternatively, may further comprise calculating an additional penetration distance in a current timestep in addition to the initial penetration distance by which a first body of the pair penetrated a second body of the pair in a prior timestep, and applying a bias proportional to the additional penetration distance without applying a bias proportional to the initial penetration distance, to thereby permit penetration in the current timestep substantially as deep as the initial penetration distance from the prior timestep.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:
1. A computing device, comprising:
a processor configured to execute a physics engine to simulate real-time rigid body dynamics of a simulated physical system including a plurality of bodies, the physics engine being configured to:
in a setup phase prior to simulation of the real-time rigid body dynamics of the plurality of bodies, set respective initial positions of the plurality of bodies, wherein the plurality of bodies includes one or more first pairs of colliding bodies each having an initial penetration and one or more second pairs of non-colliding bodies without initial penetrations;
subsequently to the setup phase, for each frame of a plurality of sequential frames, iteratively loop through a collision detection phase, a solving phase, an updating phase, and an output phase for that frame;
in the collision detection phase for a current frame of the plurality of sequential frames:
identify one or more colliding pairs of bodies of the plurality of bodies;
for each identified pair, determine that a penetration exists between the pair of bodies; and
for each of the one or more first pairs of colliding bodies, store a corresponding initial penetration distance for each respective first pair in memory;
in the solving phase for the current frame, for each identified pair of colliding bodies:

based at least in part on the corresponding initial penetration distance stored for each of the one or more first pairs, determine whether the penetration is due to the initial penetration of the setup phase between the pair of colliding bodies maintained from the setup phase into the current frame;

when the penetration is determined to be due to the initial penetration of the setup phase, permit the initial penetration between the pair of colliding bodies during the solving phase for the current frame by not applying a bias or position change to correct for the initial penetration; and when the penetration is determined to not be due to the initial penetration of the pair of colliding bodies maintained from the setup phase into the current frame, apply a bias to or calculate a position change for at least one of the bodies as an estimated correction for the penetration;

in the updating phase for the current frame:

when the penetration is determined to not be due to the initial penetration of the pair of colliding bodies maintained from the setup phase into the current frame, reposition the at least one of the bodies based upon the applied bias or position change computed as the estimated correction for the penetration; and in the output phase for the current frame, output data representations of the plurality of bodies, wherein a respective different output phase occurs for each frame of the plurality of sequential frames simulated by the physics engine.

2. The computing device of claim 1, wherein the output phase is a display phase in which the data representations of the pair of bodies are output to a display associated with the computing device.

3. The computing device of claim 2,
wherein during the solving phase for the current frame, the processor is further configured to:
calculate a total penetration distance between the pair of bodies in the solving phase for the current frame;
read an initial penetration distance for the pair of bodies in a prior frame that occurs immediately before the current frame in the plurality of sequential frames, wherein the initial penetration distance is read from a collision cache written during the prior frame;
calculate an additional penetration distance by subtracting the initial penetration distance from the total penetration distance; and
compute a bias or position change proportional to the additional penetration distance.

4. The computing device of claim 3, wherein the collision cache additionally includes a prior velocity of at least one of the pair of rigid bodies written by a kinematic integrator during the updating phase for the prior frame and the total penetration distance of the collision phase for the prior frame.

5. The computing device of claim 4, wherein the processor is configured to predict the total penetration distance in the solving phase for the current frame based on the prior velocity and the prior penetration distance from the prior frame based on contact points between the pair of bodies.

6. The computing device of claim 5, wherein the processor is configured to detect geometry changes by comparing the predicted penetration distance to the total penetration distance.

7. The computing device of claim 6, wherein the processor is configured to modify the initial penetration distance if a geometry change is detected.

8. The computing device of claim 7, wherein the contact points are also stored in the collision cache.

9. The computing device of claim 8, wherein the predicted penetration distance is calculated by a formula:

$$predictedPenetrationDistance(t)=totalPenetrationDistance(t-1)+M(t-1)*velocity(t-1);$$

wherein
t is a timestep;
M is a matrix which projects velocities onto distance changes; and
M is calculated from a delta time between the timesteps, contact point position and normal vector, and a center of mass of the at least one of the bodies.

10. The computing device of claim 1, wherein during the solving phase for the current frame, the processor is further configured to:
calculate a total penetration distance between the pair of bodies in the solving phase for the current frame;
read a Jacobian matrix and constraint biases for the collision phase for a prior frame for the pair of bodies;
calculate an additional penetration distance by subtracting the initial penetration distance from the total penetration distance; and
compute constraint biases proportional to the additional penetration distance.

11. A method for use with a computing device, the method comprising:
at a physics engine executed by a processor of the computing device to simulate real-time rigid body dynamics of a simulated physical system including a plurality of bodies:
in a setup phase prior to simulation of the real-time rigid body dynamics of the plurality of bodies, setting respective initial positions of the plurality of bodies, wherein the plurality of bodies includes one or more first pairs of colliding bodies each having an initial penetration and one or more second pairs of non-colliding bodies without initial penetrations;
subsequently to the setup phase, for each frame of a plurality of sequential frames, iteratively loop through a collision detection phase, a solving phase, an updating phase, and an output phase for that frame;
in the collision detection phase for a current frame of the plurality of sequential frames:
identifying one or more colliding pairs of bodies of the plurality of bodies;
for each identified pair, determining that a penetration exists between the pair of bodies; and
for each of the one or more first pairs of colliding bodies, storing a corresponding initial penetration distance for each respective first pair in memory;
in the solving phase for the current frame, for each identified pair of colliding bodies:
based at least in part on the corresponding initial penetration distance stored for each of the one or more first pairs, determining whether the penetration is due to the initial penetration of the setup phase between the pair of colliding bodies maintained from the setup phase into the current frame;
when the penetration is determined to be due to the initial penetration of the setup phase, permitting the initial penetration between the pair of colliding bodies during the solving phase for the current frame by not applying a bias or position change to correct for the initial penetration; and when the penetration is determined to not be due to the initial penetration of the pair of colliding bodies maintained from the setup phase into the current frame, applying a bias to or calculate a position change for at least one of the bodies as an estimated correction for the penetration;

in the updating phase for the current frame:

when the penetration is determined to not be due to the initial penetration of the pair of colliding bodies maintained from the setup phase into the current frame, repositioning the at least one of the bodies based upon the applied bias or position change computed as the estimated correction for the penetration; and in the output phase for the current frame, outputting data representations of the plurality of bodies, wherein a respective different output phase occurs for each frame of the plurality of sequential frames simulated by the physics engine.

12. The method of claim 11, wherein the output phase is a display phase in which the data representations of the pair of bodies are output to a display associated with the computing device.

13. The method of claim 12, wherein during the solving phase for the current frame, the method further comprises:

calculating a total penetration distance between the pair of bodies in the solving phase for the current frame;

reading an initial penetration distance for the pair of bodies in a prior frame that occurs immediately before the current frame in the plurality of sequential frames, wherein the initial penetration distance is read from a collision cache written during the prior frame;

calculating an additional penetration distance by subtracting the initial penetration distance from the total penetration distance; and computing a bias or position change proportional to the additional penetration distance.

14. The method of claim 13, wherein the collision cache additionally includes a prior velocity of at least one of the pair of rigid bodies written by a kinematic integrator during the updating phase for the prior frame and the total penetration distance from the collision detection phase for the prior frame.

15. The method of claim 14, wherein calculating the predicted penetration distance in the solving phase for the current frame is based on the prior velocity and the penetration distance from the prior frame based on contact points between the pair of bodies.

16. The method of claim 15, wherein the contact points are also stored in the collision cache.

17. The method of claim 16, wherein the predicted penetration distance is calculated by a formula:

$$predictedPenetrationDistance(t) = totalPenetrationDistance(t-1) + M(t-1) * velocity(t-1);$$

wherein t is a timestep;

M is a matrix which projects velocities onto distance changes; and

M is calculated from a delta time between the timesteps, contact point position and normal vector, and a center of mass of the at least one of the bodies.

18. The method of claim 11, wherein during the solving phase for the current frame, the processor is further configured to:

calculate a total penetration distance between the pair of bodies in the solving phase for the current frame;

read a Jacobian matrix and constraint biases for the collision phase for a prior frame for the pair of bodies;

calculate an additional penetration distance by subtracting the initial penetration distance from the total penetration distance; and compute constraint biases proportional to the additional penetration distance.

19. A method for use with a computing device, the method comprising:

at a physics engine executed by a processor of the computing device to simulate real-time rigid body dynamics of a simulated physical system including a plurality of bodies:

in a setup phase prior to simulation of the real-time rigid body dynamics of the plurality of bodies, setting respective initial positions of the plurality of bodies, wherein the plurality of bodies includes one or more first pairs of colliding bodies each having an initial penetration and one or more second pairs of non-colliding bodies without initial penetrations;

for each first pair of bodies of the plurality of bodies:

subsequently to the setup phase, for each frame of a plurality of sequential frames:

for each of the one or more first pairs of colliding bodies, storing a corresponding initial penetration distance for each respective first pair in memory; and iteratively solving kinematic equations over a series of timesteps to enforce non-penetration constraints between the rigid bodies in the pair while, based at least in part on the corresponding initial penetration distance stored for each of the one or more first pairs, permitting penetration in each current timestep as deep as the initial penetration distance of the setup phase maintained from the setup phase into a current frame occurring; and for each frame of the plurality of sequential frames simulated by the physics engine, outputting data representations of the plurality of bodies.

20. The method of claim 19, further comprising:

calculating an additional penetration distance in a current timestep in addition to the initial penetration distance by which a first body of the pair penetrated a second body of the pair in a prior timestep; and applying a bias proportional to the additional penetration distance without applying a bias proportional to the initial penetration distance, to thereby permit penetration in the current timestep as deep as the initial penetration distance from the prior timestep.

* * * * *